United States Patent
Hamaguchi et al.

(10) Patent No.: US 9,324,895 B2
(45) Date of Patent: Apr. 26, 2016

(54) SOLAR CELL MODULE AND MANUFACTURING METHOD THEREOF

(75) Inventors: Tsuneo Hamaguchi, Chiyoda-ku (JP);
Yoshimi Yabugaki, Chiyoda-ku (JP);
Daisuke Echizenya, Chiyoda-ku (JP);
Shinsuke Miyamoto, Chiyoda-ku (JP)

(73) Assignee: MITSUBISHI ELECTRIC CORPORATION, Chiyoda-Ku, Tokyo (JP)

(*) Notice: Subject to any disclaimer, the term of this patent is extended or adjusted under 35 U.S.C. 154(b) by 98 days.

(21) Appl. No.: 13/885,830

(22) PCT Filed: Jun. 20, 2011

(86) PCT No.: PCT/JP2011/064058
§ 371 (c)(1),
(2), (4) Date: May 16, 2013

(87) PCT Pub. No.: WO2012/086235
PCT Pub. Date: Jun. 28, 2012

(65) Prior Publication Data
US 2013/0233375 A1  Sep. 12, 2013

(30) Foreign Application Priority Data
Dec. 21, 2010 (JP) .................. 2010-284511

(51) Int. Cl.
*H01L 31/05* (2014.01)

(52) U.S. Cl.
CPC ........ *H01L 31/0504* (2013.01); *H01L 31/0508* (2013.01); *H01L 31/0512* (2013.01); *Y02E 10/50* (2013.01)

(58) Field of Classification Search
CPC ............ H01L 31/0504; H01L 31/0508; H01L 31/0512
See application file for complete search history.

(56) References Cited

U.S. PATENT DOCUMENTS 8,481,844 B2   7/2013 Nishida et al.
2004/0266980 A1* 12/2004 Ideno et al. .................. 528/365

(Continued)

FOREIGN PATENT DOCUMENTS

CN   101373796 A   2/2009
EP   1 939 944 B1   7/2008

(Continued)

OTHER PUBLICATIONS

Office Action (Notice of Rejection) dated Aug. 20, 2013, issued by the Japanese Patent Office in the corresponding Japanese Patent Application No. 2012-549652 and an English translation thereof. (6 pages).

(Continued)

*Primary Examiner* — Marla D McConnell
(74) *Attorney, Agent, or Firm* — Buchanan Ingersoll & Rooney PC

(57) ABSTRACT

A plurality of thin linear thin wire electrodes are formed entirely over a first surface that is a light receiving surface of a solar cell element, a back surface collecting electrode is formed on a second surface that is a back surface of the solar cell element, and a wiring member which draws power is connected to each of the thin wire electrode and the back surface collecting electrode. The thin wire electrode and the wiring member are bonded with solder and side surfaces of the solder bonding portion in a longitudinal direction along the wiring member are coated with a thermosetting resin, and, in a region excluding the thin wire electrodes, the wiring member and the first surface are bonded with a thermosetting resin. The wiring member and the thin wire electrodes are bonded to have a sufficient mechanical bonding strength and high bonding reliability.

9 Claims, 6 Drawing Sheets

(56) References Cited

U.S. PATENT DOCUMENTS

| | | |
|---|---|---|
| 2005/0199279 A1 | 9/2005 | Yoshimine et al. |
| 2008/0149161 A1 | 6/2008 | Nishida et al. |
| 2009/0032081 A1 | 2/2009 | Saita et al. |

FOREIGN PATENT DOCUMENTS

| | | |
|---|---|---|
| JP | 2000-261012 A | 9/2000 |
| JP | 2005-217148 A | 8/2005 |
| JP | 2005-243935 A | 9/2005 |
| JP | 2007-016127 A | 1/2007 |
| JP | 2008-159895 A | 7/2008 |
| JP | 2008-288333 A | 11/2008 |
| JP | 2008-294366 A | 12/2008 |
| JP | 2009-054981 A | 3/2009 |
| WO | WO 2009/011209 A1 | 1/2009 |

OTHER PUBLICATIONS

International Search Report (PCT/ISA/210) issued on Jul. 19, 2011, by the Japanese Patent Office as the International Searching Authority for International Application No. PCT/JP2011/064058.

Written Opinion (PCT/ISA/237) issued on Jul. 19, 2011, by the Japanese Patent Office as the International Searching Authority for International Application No. PCT/JP2011/064058.

Office Action issued on Feb. 10, 2015, by the Chinese Patent Office in corresponding Chinese Patent Application No. 201180060520.6 and an English translation of the Office Action. (10 pages).

* cited by examiner (a0)

(a1)

(a2)

(b0)

(b1)

(b2)

(c0)

(c1)

(c2)

(a0)

(a1)

(a2)

(b0)

(b1)

(b2)

(c0)

(c1)

(c2)

(a1)

(a2)

(a)

(b)

SOLAR CELL MODULE AND MANUFACTURING METHOD THEREOF

FIELD

The present invention relates to a solar cell module in which solar cell elements are connected by a wiring member and a manufacturing method thereof.

BACKGROUND

Conventional solar cell elements are configured to include a silicon substrate, thin wire electrodes that collect photogenerated carriers generated in a photoelectric conversion unit region of the silicon substrate, and light-receiving-surface bus electrodes (light-receiving-surface electrodes for connecting wiring members) that are connected to the thin wire electrodes and are for transferring collected photogenerated carriers to the output wiring members.

The output wiring member is a strip-shaped elongated copper foil made of copper (Cu) and the light-receiving-surface bus electrode (light-receiving-surface electrode for connecting the wiring member) is an electrode for bonding the wiring member made of copper foil and is formed to intersect with the thin wire electrodes. The light-receiving-surface bus electrode is formed by firing conductive paste containing particles of a highly conductive material, such as silver (Ag), as a filler with glass or resin as a binder in a similar manner to the thin wire electrode. Normally, as described in Patent Literature 1 below, the light-receiving-surface bus electrode and the wiring member are bonded with solder. Sn-based Pb-free solder, such as Sn-3Ag-0.5Cu (melting point is 218° C.), or Pb—Sn solder (melting point is 183° C.) is used as solder.

In such a method of bonding the wiring member by using the light-receiving-surface bus electrode formed on the silicon substrate in advance, there are two problems. Firstly, silver (Ag) used as a material of the light-receiving-surface bus electrode is expensive and a large amount of silver is needed to form the light-receiving-surface bus electrode with a thickness of 1 to 2 mm. Accordingly, it leads to an increase in manufacturing cost. Secondly, because the wiring member is bonded along the entire length of the solar cell, the solar cell element can be warped and damaged in some cases due to differential thermal expansion between the silicon of the solar cell element and the copper of the wiring member.

Therefore, in order to solve the above problems, conventionally, as described in Patent Literature 2 below, a method is proposed in which the wiring member is directly bonded to the light receiving surface of the solar cell element with thermosetting adhesive without using the light-receiving-surface bus electrode. Specifically, in this method, thermosetting resin is arranged to intersect with the thin wire electrodes of the solar cell, the wiring members are arranged thereon, and the wiring members are connected by thermally curing the adhesive in a state where the wiring members are pressed against the adhesive. The thin wire electrodes and the wiring members are electrically connected by coming into contact with each other and the force of maintaining the contact is exerted by the thermosetting resin. With this configuration, photogenerated carriers collected in the thin wire electrodes directly flow to the wiring members. Because the light-receiving-surface bus electrode is not formed, the solar cell module can be manufactured at low cost. Moreover, because the wiring members are bonded to the silicon substrate with resin having a Young's modulus that is approximately $\frac{1}{10}$ of that of solder, warpage of the solar cell element can be reduced.

CITATION LIST

Patent Literature

Patent Literature 1: Japanese Patent Application Laid-open No. 2005-217148
Patent Literature 2: International Publication Pamphlet No. WO 2009/011209

SUMMARY

Technical Problem

As described in Patent Literature 2, if the method of bonding the wiring members to the silicon substrate with the thermosetting resin without using the light-receiving-surface bus electrode is used, the thin wire electrodes and the wiring members are electrically connected by coming into contact with each other. When the wiring member is pressed against the thermosetting resin, the thermosetting resin at a portion, at which the thin wire electrode and the wiring member are in contact with each other, is exuded and decreases. Moreover, the bonding force of the thermosetting resin is as small as approximately $\frac{1}{10}$ of that of solder. Therefore, there is a problem in that the bonding reliability between the wiring member and the thin wire electrode is reduced.

Moreover, because the thin wire electrode and the wiring member are electrically connected by coming into contact with each other, the contact resistance is as large as approximately 100 times of that of solder. Therefore, there is a problem in that the conversion efficiency decreases.

This invention is achieved in view of the above and an aspect of the present invention provides a solar cell module and a manufacturing method thereof capable of obtaining a sufficient mechanical bonding strength between the wiring member and the thin wire electrode, capable of improving the conversion efficiency by lowing the connection resistance, capable of reducing the cost by reducing the usage of silver, and capable of reducing the warpage of the solar cell element.

Solution to Problem

In order to solve the above problems and achieve the object, the solar cell module according to this invention is such that, in a solar cell module that includes a configuration in which a plurality of thin linear thin wire electrodes is formed entirely over a first surface that is a light receiving surface of a solar cell element, a back surface collecting electrode is formed on a second surface that is a back surface of the solar cell element, and a wiring member which draws power is connected to each of the thin wire electrode and the back surface collecting electrode, the thin wire electrodes and the wiring member are bonded with solder, and a solder bonding portion is reinforced by coating side surfaces of the solder bonding portion with a thermosetting resin. The height of a thermosetting resin that coats the side surfaces is equal to or smaller than ½ of a thickness of the wiring member. In a region excluding thin wire electrodes, the wiring member and the first surface are bonded with a thermosetting resin.

Moreover, the manufacturing method of the solar cell module according to this invention is such that a manufacturing method of a solar cell module that includes a configuration in which a plurality of thin linear thin wire electrodes is formed entirely over a first surface that is a light receiving surface of a solar cell element, a back surface collecting electrode is formed on a second surface that is a back surface of the solar cell element, and a wiring member which draws power is connected to each of the thin wire electrode and the back surface collecting electrode, includes a step of arranging a thermosetting resin, which contains an epoxy resin and an organic resin or uses a curing agent of an organic resin, at an arrangement position of the wiring member that is a predetermined position of the first surface, and a step of coating side surfaces of a solder bonding portion with a thermosetting resin by pressing the wiring member coated with solder against the arrangement position of the wiring member of at least the first surface and heating the wiring member to a temperature that is equal to or higher than a melting point of solder. The organic acid contains at least any of a phenol curing agent, an acid anhydride curing agent, and a carboxylic acid curing agent.

Advantageous Effects of Invention

According to the present invention, it is possible to obtain a sufficient mechanical bonding strength between the wiring member and the thin wire electrode and bonding with a low electrical connection resistance by directly bonding the wiring member to the thin wire electrode with solder. Moreover, because the bus electrode is not formed on the light receiving surface, the cost can be reduced. Moreover, because the wiring member and the light receiving surface on which the thin wire electrode is not formed are bonded with thermosetting epoxy resin composition having a Young's modulus that is approximately $\frac{1}{10}$ of that of solder, warpage of the solar cell element can be reduced compared with the structure in Patent Literature 1.

DESCRIPTION OF EMBODIMENTS

Embodiments of a solar cell module and a manufacturing method thereof according to the present invention will be described in detail below with reference to the drawings. The present invention is not limited to these embodiments.

First Embodiment

Figure 1:
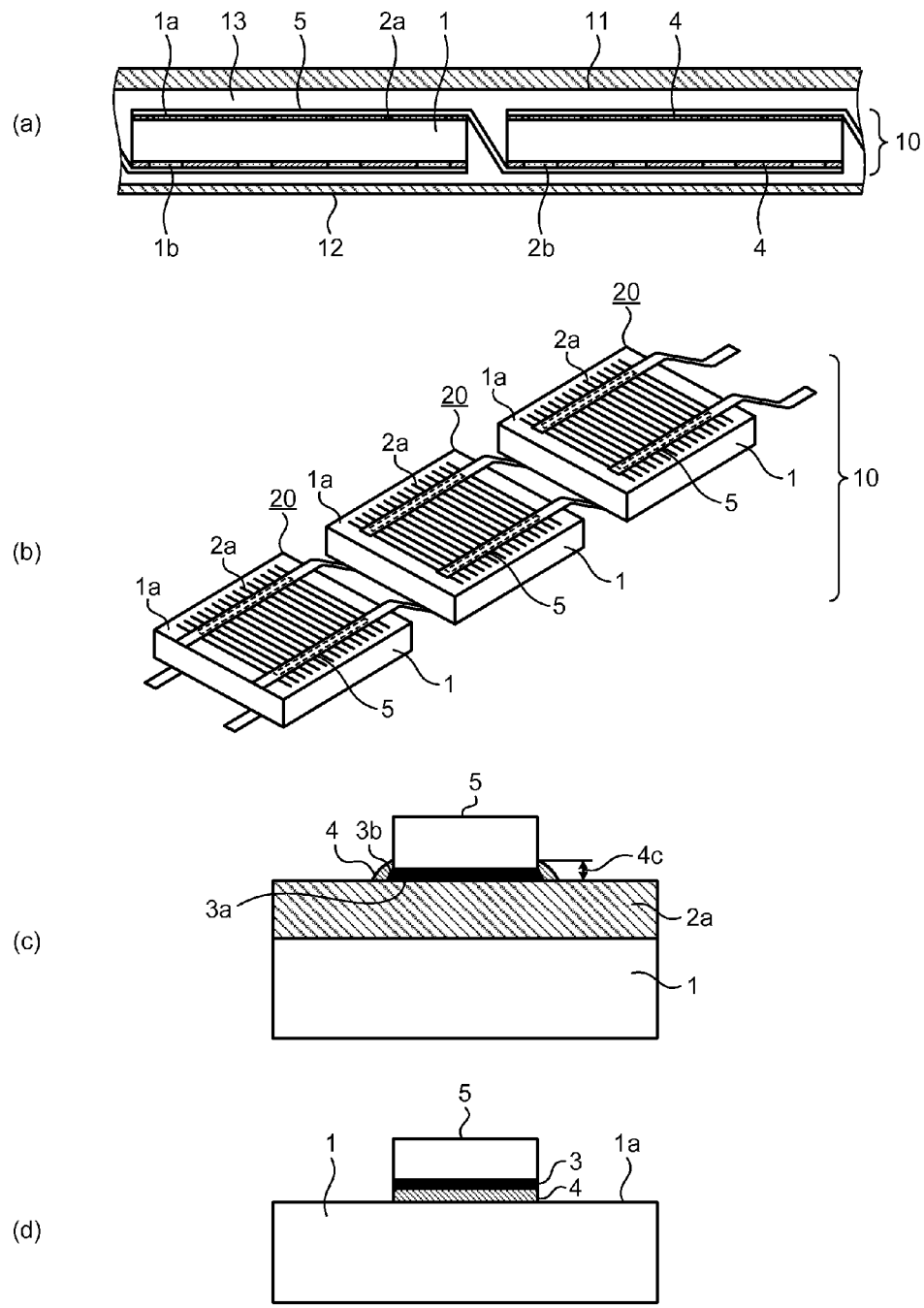
FIG. 1 is a diagram illustrating a structure of a solar cell module in a first embodiment according to the present invention.

FIG. 1 is a diagram illustrating a structure of a solar cell module in the first embodiment according to the present invention, in which (a) illustrates a cross-sectional view of the solar cell module, (b) illustrates a perspective view of a string in which a plurality of solar cell elements 1 are connected by wiring members 5, (c) illustrates a cross-sectional view of the bonding portion of a thin wire electrode (first collecting electrode) 2a and the wiring member 5, and (d) illustrates a cross-sectional view of the bonding portion of a light receiving surface 1a and the wiring member 5.

As illustrated in (a), a solar cell module 100 is such that a solar cell string 10 is obtained by connecting the light receiving surfaces 1a, which are first surfaces, and back surfaces 1b, which are second surfaces, of the solar cell elements 1 alternately by using the wiring members 5, a light-receiving-surface protective member 11 is arranged on the light receiving surface 1a side of a solar cell string 10, a back-surface protective member 12 is arranged on the back surface 1b side, and a sealing member 13 is arranged between the solar cell string 10 and the protective members 11 and 12. The thin wire electrode 2a formed on the light receiving surface 1a and the wiring member 5 are bonded with solder 3 and the side surfaces of the solder bonding portion are coated with thermosetting resin, and, in the region other than the region in which the thin wire electrodes 2a are formed, the wiring member 5 and the light receiving surface 1a are bonded with thermosetting resin 4.

(b) illustrates a perspective view of the solar cell string 10. The solar cell string 10 is configured by connecting the solar cell elements 1 by the wiring members 5. The solar cell element 1 is, for example, configured as follows by using a p-type silicon having a thickness of approximately 100 to 200 μm as a substrate. On the light receiving surface 1a side of the p-type silicon substrate to be a p-type layer, an n-type diffusion layer (impurity layer diffusion layer: not shown) is formed by phosphorus diffusion and moreover, an anti-reflective film composed of a silicon nitride film is provided by a surface treatment for improving the conversion efficiency by preventing reflection of incident light, thereby forming the first surface, i.e., the light receiving surface 1a (photoelectric conversion unit region) of the solar cell element 1. Moreover, a p+ layer containing a high-concentration impurity is formed on the second surface, i.e., the back surface 1b of the p-type silicon substrate (hereinafter, simply substrate), and moreover, back surface collecting electrodes (second collecting electrodes) 2b are provided on the second surface for reflecting incident light and drawing power in a similar manner to the first surface.

(c) and (d) illustrate cross-sectional views of a state where the wiring member 5 is bonded to the light receiving surface 1a of the solar cell element 1. (c) illustrates a cross section of the bonding portion of the thin wire electrode 2a on the light receiving surface 1a and the wiring member 5, and (d) illustrates a cross section of the bonding portion of the light receiving surface 1a on which the thin wire electrode is not formed and the wiring member 5. The thin wire electrode 2a on the light receiving surface 1a of the solar cell element 1 and the wiring member 5 are bonded with the solder 3, and a solder bonding portion 3a is reinforced by coating side surfaces 3b of the solder bonding portion 3a with the thermosetting resin 4. The interface between the wiring member 5 and the solder 3 and the interface between the thin wire electrode 2a and the solder 3 are coated with the thermosetting resin 4. The thermosetting resin 4 that coats the solder bonding portion 3a has a function of relieving the shear force generated due to differential thermal expansion between the wiring member 5 and the solar cell element 1 and a function of suppressing generation of a crack generated due to the fatigue of the solder bonding portion. Because the thermal expansion of the thermosetting resin 4 is approximately four times larger than that of the wiring member 5, if the amount of the thermosetting resin 4 that coats the side surfaces of the wiring member 5 is large, the force of lifting the wiring member 5 acts on the wiring member 5. This may lead to a decrease of the bonding reliability due to the force of separating the solder bonding portion 3a. Therefore, a height 4c of the thermosetting resin 4 that coats the side surfaces of the wiring member 5 needs to be lower than the thickness of the wiring member 5, and, in order to reduce the strain of the side surfaces 3b of the solder bonding portion 3a, the height 4c needs to be ½ of the thickness of the wiring member 5. The thermal expansion of the thermosetting resin is 50 to $60 \times 10^{-6}$ 1/° C. and the reliability can be further improved by reducing the thermal expansion to 20 to $40 \times 10^{-6}$ 1/° C. by mixing fine particles, such as silica. In the region other than the thin wire electrodes 2a, the wiring member 5 and the light receiving surface 1a are bonded with the thermosetting resin 4. In FIG. 1, the thermosetting resin 4 coats the interface between the wiring member 5 and the solder and the interface between the thin wire electrode 2a and the solder; however, it is sufficient that the thermosetting resin 4 coats at least the interface between the thin wire electrode 2a and the solder 3, between which there is large differential thermal expansion.

As the solder 3, Pb-free solder, such as Sn-3Ag-0.5Cu (melting point is 220° C.), Sn-3.5Ag (melting point is 221° C.), Sn-0.7Cu (melting point is 230° C.), and Sn-8.8Zn (melting point is 199° C.) may be used, or Pb—Sn (melting point is 183° C.) solder may be used.

The thin wire electrodes 2a for collecting power and the wiring members 5 are bonded with the solder 3; therefore, the electrical resistance at the bonding portion can be reduced. Furthermore, the electrical connection area can be increased compared with the conventional method (Patent Literature 2) in which resin adhesive containing conductive particles is used. Thus, it is possible to realize bonding that does not degrade the electrical characteristics. Moreover, because the wiring members 5 and the light receiving surface 1a are bonded with the thermosetting resin having a low Young's modulus (approximately ⅒ of that of solder), warpage of the solar cell element 1 can be reduced. The thermosetting resin 4 that is mainly composed of epoxy resin is used.

On the other hand, the back surface collecting electrodes 2b are provided on the second surface of the solar cell element 1. The back surface collecting electrodes 2b are provided at positions (positions at which the back surface collecting electrodes 2b overlap with the wiring members 5 in the thickness direction of the solar cell element 1) corresponding to the wiring members 5 on the light receiving surface 1a side that is the first surface. The back surface collecting electrode 2b is formed on the entire surface of the back surface 1b, is an electrode made of silver and is formed linearly in the longitudinal direction of the solar cell element 1 that is the same direction as the wiring member 5, or is formed in an island pattern. In the present embodiment, as illustrated in the cross-sectional view of FIG. 1, the back surface collecting electrodes 2b formed into an island pattern are bonded by using a method same as the thin wire electrodes 2a on the light receiving surface 1a.

Because the back surface collecting electrodes 2b are formed on the back surface that is not the light receiving surface, the electrode size can be increased. Therefore, as another method of bonding the back surface collecting electrodes 2b and the wiring members 5, the back surface collecting electrodes 2b and the wiring members 5 may be bonded by using thermosetting adhesive containing conductive particles having a large connection resistance or may be bonded with solder using flux same as a typical solder bonding.

In the present embodiment, the solar cell module includes the solar cell string 10 formed by connecting the solar cell elements 1, the protective members 11 and 12, and the sealing member 13; however, the solar cell module is not limited thereto and a module that includes the solar cell elements 1 that include the thin wire electrodes 2a and the back surface collecting electrodes 2b to which the wiring members 5 are bonded is also called the solar cell module.

Moreover, the solar cell element 1 in the present embodiment has a substantially flat plate shape; however, the solar cell element 1 is not limited to having a flat plate shape and, for example, the solar cell element 1 may have a flexible sheet shape, a cubic shape, or the like and any shape can be applied as long as the solar cell element is such that the wiring members 5 are bonded to the thin wire electrodes 2a formed on the light receiving surface 1a. In the present embodiment, the solar cell string 10, in which the solar cell elements 1 are connected by the wiring members 5, is illustrated; however, the solar cell string 10 may have one solar cell element 1.

Furthermore, the thin wire electrodes 2a in the present embodiment are formed parallel to each other on the light receiving surface 1a; however, the thin wire electrodes 2a may not be parallel to each other and any form may be applied as long as the solar cell element is such that a plurality of the thin wire electrodes 2a are formed on the light receiving surface 1a.

Second Embodiment

Figure 2:
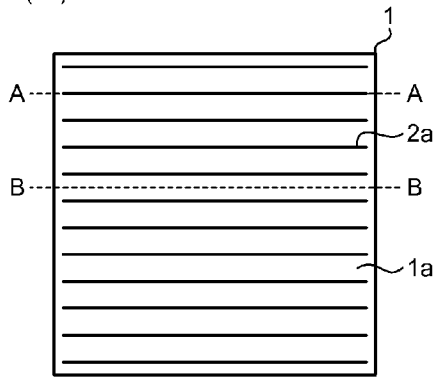
FIG. 2 is a diagram for explaining a method of bonding a solar cell element and wiring members, illustrating a solar cell module in a second embodiment according to the present invention.
Figure 2:
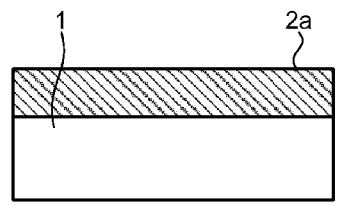
Figure 2:
Figure 2:
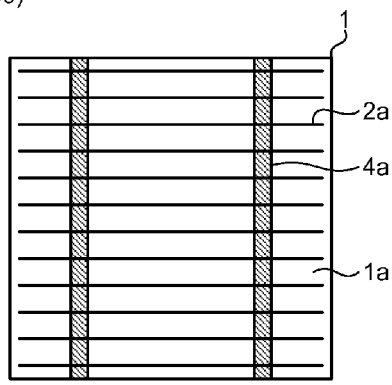
Figure 2:
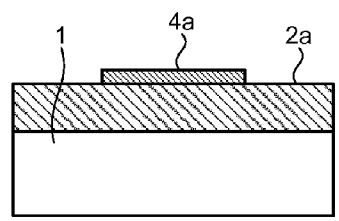
Figure 2:
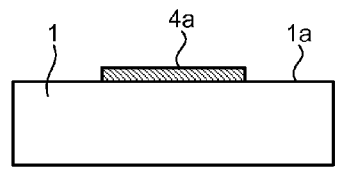
Figure 2:
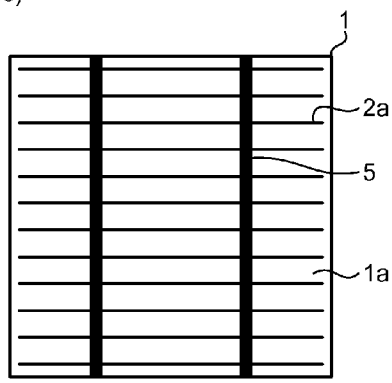
Figure 2:
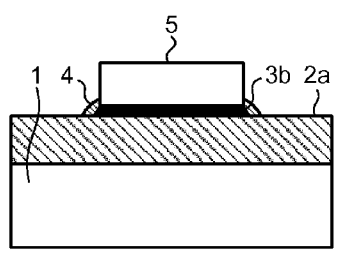
Figure 2:
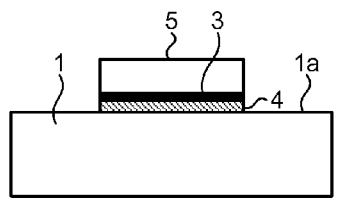

FIG. 2 is a diagram for sequentially explaining a method of bonding the solar cell element 1 and the wiring members 5, illustrating a solar cell module in the second embodiment according to the present invention. (a0) in FIG. 2 is a plan view of the light receiving surface 1a of the solar cell element 1. A plurality of the thin wire electrodes 2a are formed parallel to each other on the light receiving surface 1a. (a1) is a cross-sectional view along line A-A in (a0) illustrating a cross section of the thin wire electrode 2a in a direction that intersects with the wiring members 5. (a2) is a cross-sectional view along line B-B in (a0) illustrating a cross section of a region other than the thin wire electrodes 2a.

(b0) in FIG. 2 is a plan view of the light receiving surface 1a in a state where a thermosetting epoxy resin composition 4a before being cured, which contains an organic acid or uses an organic acid as a curing agent, is arranged. (b1) illustrates a cross section of the thin wire electrode 2a in a direction that intersects with the wiring members 5 at a position (hereinafter, simply line A-A position) in (b0) corresponding to the line A-A position. (b2) illustrates a cross section of a region other than the thin wire electrodes 2a at a position in (b0) (hereinafter, simply line B-B corresponding position) corresponding to the line B-B corresponding position.

The thermosetting epoxy resin composition 4a contains epoxy resin, and further contains an organic acid or uses an organic acid as a curing agent. The organic acid contains a phenol curing agent and/or an acid anhydride curing agent, and/or a carboxylic acid curing agent. In the present embodiment, the paste-like thermosetting epoxy resin composition 4a is used; however, a film in a semi-cured state (stage B) may be used.

(c0) in FIG. 2 is a plan view of the light receiving surface 1a in a state where the wiring members 5 that are coated with the solder 3 on the light receiving surface 1a side are positioned, pressed, and heated. (c1) is a cross-sectional view at the line A-A corresponding position in (c0). (c2) is a cross-sectional view at the line B-B corresponding position in (c0).

The wiring members 5 and the thin wire electrodes 2a can be bonded with the solder 3 and the side surfaces 3b of the solder bonding portion 3a can be coated with the thermosetting resin 4, and, in the region other than the thin wire electrodes 2a, the wiring members 5 and the light receiving surface 1a can be bonded with the thermosetting resin 4. The heating is performed in two stages. In the first stage, the pressing is performed at a low temperature of around 100° C. The viscosity of the thermosetting epoxy resin composition 4a becomes the lowest at a low temperature of around 100° C.; therefore, when the pressing is performed, the thermosetting epoxy resin composition 4a is exuded to the sides, whereby the thin wire electrode 2a and the wiring member 5 can be brought into contact with each other. In the second stage, the temperature is raised to the temperature that is equal to or higher than the melting point of the solder 3, which is equal to or higher than the curing temperature of the thermosetting resin 4.

Because the thermosetting resin 4 contains an organic acid or uses an organic acid as a curing agent, when the thermosetting resin 4 is thermally cured in the solder bonding, the thermosetting resin 4 exerts an effect of reducing and removing the oxide film of the solder surface, whereby the oxide film on the surface of the wiring member 5 is removed and the wiring member 5 and the thin wire electrode 2a can be bonded with the solder 3.

Because an organic acid contained in the thermosetting epoxy resin composition 4a functions as flux, it is not necessary to apply flux before soldering and clean the flux after solder bonding as in the typical soldering; therefore, the productivity is high. Moreover, a concern that residue of the flux remains on the light receiving surface 1a and residual ions cause degradation of the characteristics is eliminated.

In the present embodiment, the solder 3 is provided on the surface of the wiring member 5, which faces the light receiving surface 1a side; however, the solder 3 may be provided around the wiring member 5. In contrast, the solder 3 may be provided in advance on the surface of the thin wire electrode 2a. In the region other than the thin wire electrodes 2a, the wiring member 5 and the surface of the light receiving surface 1a come into contact with each other with the thermosetting epoxy resin composition 4a therebetween at a low temperature (around 100° C.) in the first stage. The thermosetting epoxy resin composition 4a is cured at a temperature in the second stage so as to be the thermosetting resin 4. The wiring member 5 is bonded to the light receiving surface 1a by this thermal curing. In FIG. 2, the thermosetting resin 4 coats the interface between the wiring member 5 and the solder and the interface between the thin wire electrode 2a and the solder; however, it is sufficient that the thermosetting resin 4 coats at least the interface between the thin wire electrode 2a and the solder 3, between which there is large differential thermal expansion.

Third Embodiment

Figure 3:
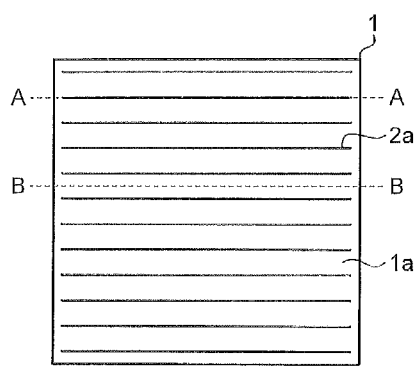
FIG. 3 is a diagram for explaining a method of bonding a solar cell element and wiring members, illustrating a solar cell module in a third embodiment according to the present invention.
Figure 3:
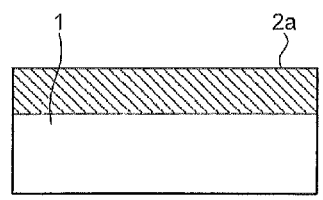
Figure 3:
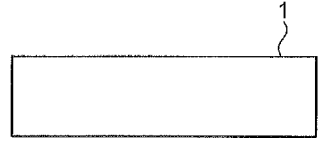
Figure 3:
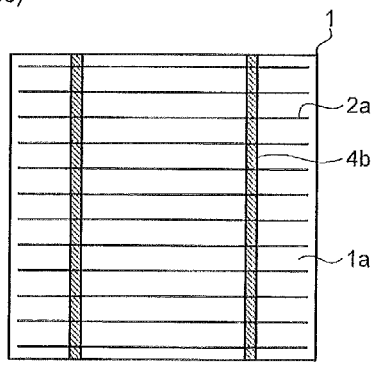
Figure 3:
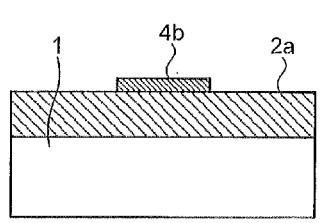
Figure 3:
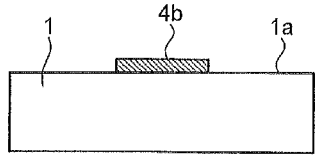
Figure 3:
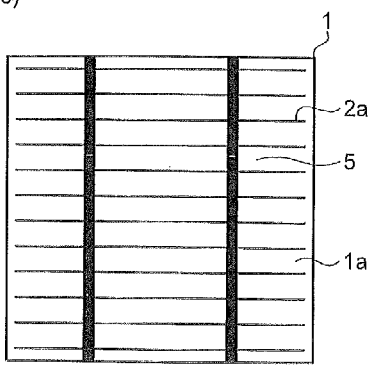
Figure 3:
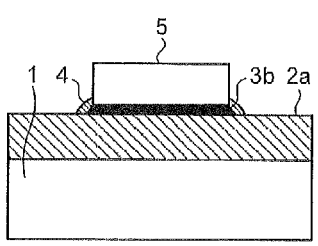
Figure 3:
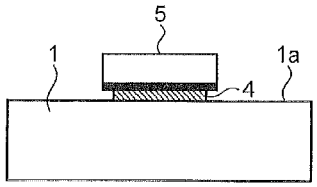

FIG. 3 is a diagram for explaining a method of bonding the solar cell element 1 and the wiring members 5, illustrating a solar cell module in the third embodiment according to the present invention. (a0) in FIG. 3 is a diagram for explaining the method of bonding the solar cell element 1 and the wiring members 5. (a1) is a cross-sectional view at the line A-A corresponding position in (a0). (a2) is a cross-sectional view at the line B-B corresponding position in (a0). A plurality of the thin wire electrodes 2a are formed parallel to each other on the light receiving surface 1a of the solar cell element 1.

(b0) in FIG. 3 is a diagram illustrating a state where a thermosetting epoxy resin composition 4b before being cured, whose width is made smaller than that of the wiring member 5 and which contains an organic acid or uses an organic acid as a curing agent, is arranged. (b1) is a cross-sectional view at the line A-A corresponding position in (b0). (b2) is a cross-sectional view at the line B-B corresponding position in (b0). The thermosetting epoxy resin composition 4b is applied such that the width thereof before being cured is smaller than the width of the wiring member 5. For example, when the width of the wiring member is 1 mm, the width of the thermosetting epoxy resin composition 4b is set to approximately 0.5 mm. The thermosetting epoxy resin composition 4b contains epoxy resin, and contains a phenol curing agent, and/or an acid anhydride curing agent, and/or a carboxylic acid curing agent, which is an organic acid curing agent that exhibits flux activity. In the present embodiment, the paste-like thermosetting epoxy resin composition 4b is used; however, a film in a semi-cured state (stage B) may be used.

(c0) in FIG. 3 is a diagram illustrating a state where the thermosetting epoxy resin composition 4b before being cured, whose width is reduced and which contains an organic acid or uses an organic acid as a curing agent, is arranged, and the wiring members 5 coated with solder are positioned, pressed, and heated at a temperature that is equal to or higher than the melting point of the solder. (c1) is a cross-sectional view at the line A-A corresponding position in (c0). (c2) is a cross-sectional view at the line B-B corresponding position in (c0). Because the application width of the thermosetting epoxy resin composition 4b before being cured is made smaller than the width of the wiring member 5, even if the pressing position of the wiring member is displaced, the thermosetting epoxy resin composition 4b does not protrude from the wiring member 5 after thermal curing. Therefore, it is possible to eliminate the problem that the thermosetting resin 4 protrudes toward the light receiving surface and the light receiving area is reduced. In FIG. 3, the thermosetting resin 4 coats the interface between the wiring member 5 and the solder and the interface between the thin wire electrode 2a and the solder; however, it is sufficient that the thermosetting resin 4 coats at least the interface between the thin wire electrode 2a and the solder 3, between which there is large differential thermal expansion.

Fourth Embodiment

Figure 4:
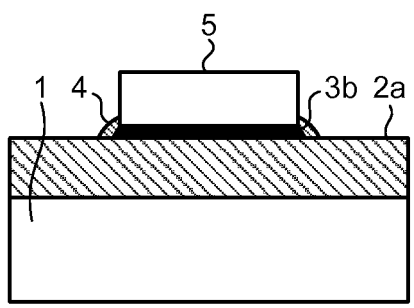
FIG. 4 is a diagram illustrating a cross section of a state where a wiring member is bonded to a light receiving surface of a solar cell element, illustrating a solar cell module in a fourth embodiment according to the present invention.
Figure 4:
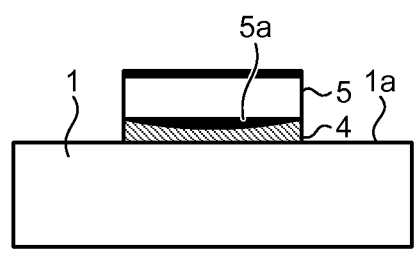

FIG. 4 illustrates a cross-sectional view of a state where the wiring member 5 is bonded to the light receiving surface 1a of the solar cell element 1, illustrating a solar cell module in the fourth embodiment according to the present invention. (a1) illustrates a cross-sectional view of the bonding portion of the thin wire electrode 2a on the light receiving surface 1a and the wiring member 5. (a2) is a cross-sectional view illustrating a bonding state of the wiring member 5 and the light receiving surface 1a in the region other than the thin wire electrodes 2a.

In (a1), the thin wire electrode 2a on the light receiving surface 1a of the solar cell element 1 and the wiring member 5 are bonded with the solder 3 and the solder bonding portion 3a is reinforced by coating the side surfaces 3b of the solder bonding portion 3a with the thermosetting resin 4. In (a2), the light receiving surface 1a excluding the thin wire electrode 2a and the wiring member 5 are bonded with the thermosetting resin 4. The surface of the wiring member 5 on the side that faces the light receiving surface 1a forms a protrusion-shaped portion 5a. This has an effect of increasing the adhesive area and thus increasing the adhesion force. Because the protrusion-shaped portion 5a can increase the clearance between the wiring member 5 and the light receiving surface 1a toward the outside from the center of the wiring member, the space for holding the thermosetting resin 4 can be increased and therefore the protrusion-shaped portion 5a also has an effect of suppressing protrusion of the thermosetting resin 4 toward the light receiving surface 1a. The size of the protrusion to be used is such that the amount of protrusion is approximately 15 to 30 μm with respect to the width of 1 mm. In FIG. 4, the thermosetting resin 4 coats the interface between the wiring member 5 and the solder and the interface between the thin wire electrode 2a and the solder; however, it is sufficient that the thermosetting resin 4 coats at least the interface between the thin wire electrode 2a and the solder 3, between which there is large differential thermal expansion.

The protrusion-shaped portion 5a in the present embodiment is formed by coating the surface of the copper plate surface of the wiring member 5 with solder and melting the solder; however, the protrusion-shaped portion 5a may be formed by mechanically processing the copper plate into a protruding shape.

Fifth Embodiment

Figure 5:
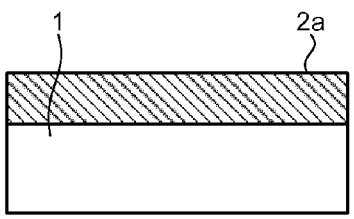
FIG. 5 is a diagram illustrating a manufacturing method of a solar cell module in a fifth embodiment according to the present invention.
Figure 5:
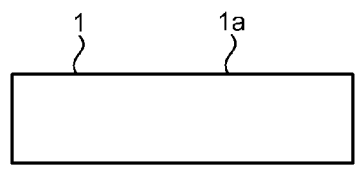
Figure 5:
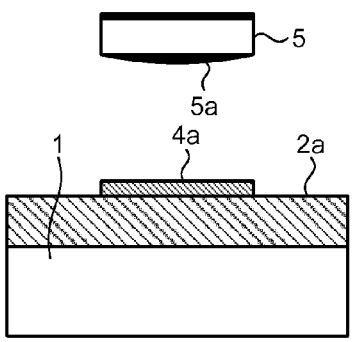
Figure 5:
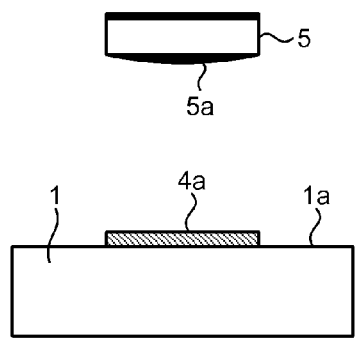
Figure 5:
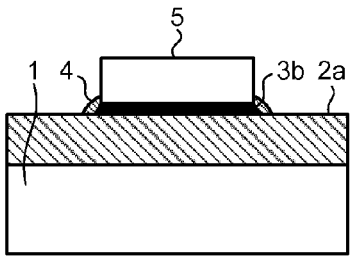
Figure 5:
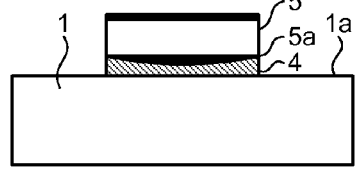

FIG. 5 is a diagram illustrating a manufacturing method of a solar cell module in the fifth embodiment according to the present invention. (a1) and (a2) are cross-sectional views of a portion in which the thin wire electrode 2a is present and a portion in which the thin wire electrode 2a is not present, of the solar cell element 1. (b1) and (b2) are cross-sectional views of a portion in which the thin wire electrode 2a is present and a portion in which the thin wire electrode 2a is not present, illustrating a state where the thermosetting epoxy resin composition 4a before being cured, which contains an organic acid or uses an organic acid as a curing agent, is arranged. The thermosetting epoxy resin composition 4a before being cured contains epoxy resin, and contains a phenol curing agent, and/or an acid anhydride curing agent, and/or a carboxylic acid curing agent, which is an organic acid curing agent that exhibits flux activity. The thermosetting epoxy resin composition 4a may be liquid or a film in a semi-cured state (stage B). The thermosetting epoxy resin composition 4a is cured so as to be the thermosetting resin 4.

(c1) and (c2) in FIG. 5 are cross-sectional views of a portion in which the thin wire electrode 2a is present and a portion in which the thin wire electrode 2a is not present, illustrating a state where the wiring member 5 that is coated with solder and includes the protrusion-shaped portion 5a is positioned, pressed, and heated. The wiring member 5 and the thin wire electrode 2a are bonded with the solder 3 and the side surfaces 3b of the solder bonding portion 3a are coated with the thermosetting resin 4, and, in the region other than the thin wire electrodes 2a, the wiring member 5 is bonded to the light receiving surface 1a with the thermosetting resin 4. In FIG. 5, the thermosetting resin 4 coats the interface between the wiring member 5 and the solder and the interface between the thin wire electrode 2a and the solder; however, it is sufficient that the thermosetting resin 4 coats at least the interface between the thin wire electrode 2a and the solder 3, between which there is large differential thermal expansion.

The heating is performed in two stages. In the first stage, the pressing is performed at 100° C. The viscosity of the thermosetting epoxy resin composition 4a becomes the lowest at a low temperature of around 100° C.; therefore, when the pressing is performed, the thermosetting epoxy resin composition 4a is exuded, whereby the thin wire electrode 2a and the wiring member 5 are brought into contact with each other.

In the second stage, the temperature is raised to the temperature that is equal to or higher than the curing temperature of the thermosetting resin 4 and is equal to or higher than the melting point of the solder 3. Because the thermosetting resin 4 contains an organic acid or uses an organic acid as a curing agent, when the thermosetting resin 4 is thermally cured in the solder bonding, the thermosetting resin 4 exerts an effect of reducing and removing the oxide film of the solder surface, whereby the oxide film on the surface of the wiring member 5 is removed and the wiring member 5 and the thin wire electrode 2a can be bonded with the solder 3. Moreover, the solder bonding portion 3a can be reinforced by coating the side surfaces 3b of the solder bonding portion 3a with the thermosetting resin 4.

In the region other than the thin wire electrodes 2a, the viscosity of the thermosetting epoxy resin composition 4a before being cured becomes low at the temperature in the first stage; therefore, the surface of the thermosetting epoxy resin composition 4a spreads toward the sides along the surface of the wiring member 5 on which the protrusion-shaped portion 5a is formed. Because the protruded surface shape can increase the clearance between the wiring member 5 and the light receiving surface 1a toward the outside from the center of the wiring member 5, the space for holding the thermosetting resin 4 can be increased and therefore the protruded surface shape has an effect of suppressing protrusion of the thermosetting resin 4 toward the light receiving surface 1a. Therefore, even if the amount of application of the thermosetting epoxy resin composition 4a is large, protrusion of the thermosetting epoxy resin composition 4a can be suppressed. At the temperature in the second stage, the thermosetting epoxy composition 4b is thermally cured and thus the wiring member 5 and the light receiving surface 1a can be bonded to each other.

Sixth Embodiment

Figure 6:
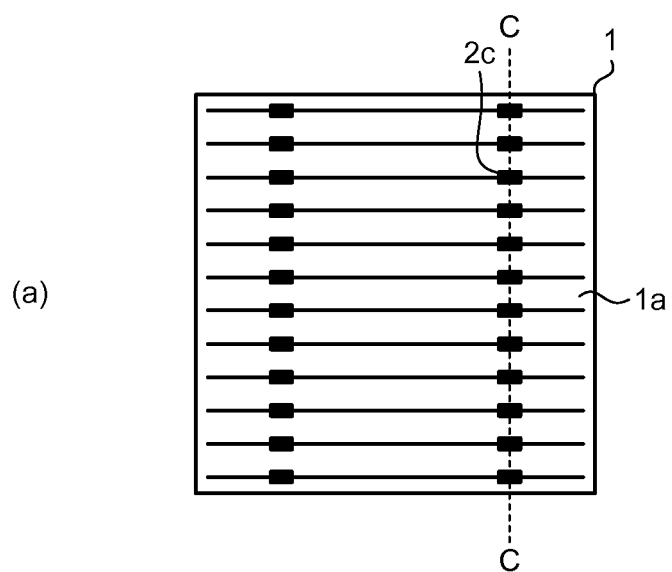
FIG. 6 is a plan view of a solar cell element surface and a cross-sectional view of a solder bonding portion of a thin wire electrode, illustrating a solar cell module in a sixth embodiment according to the present invention.
Figure 6:
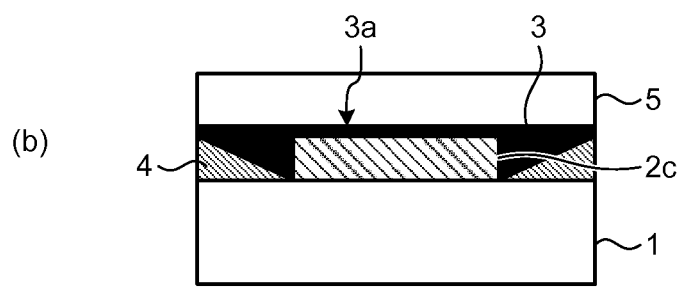

FIG. 6 is a plan view of the surface of a solar cell element and a cross-sectional view of the solder bonding portion of a thin wire electrode, illustrating a solar cell module in the sixth embodiment according to the present invention. (a) in FIG. 6 illustrates a plan view illustrating the light receiving surface 1a of the solar cell element 1. (b) in FIG. 6 illustrates a cross-sectional view at the line C-C corresponding position in the wiring direction in a state where the wiring member 5 is bonded. In the present embodiment, in order to increase the area of the solder bonding region of a thin wire electrode 2c and the wiring member 5, the thin wire electrode 2c is partially enlarged in a direction in which the wiring member 5 extends at a position at which the thin wire electrode 2c overlaps with the wiring member 5, whereby the bonding force of the thin wire electrode 2c to the solar cell element 1 can be increased; therefore, the bonding reliability can be improved.

INDUSTRIAL APPLICABILITY

As above, the solar cell module according to the present invention is suitable for being applied to a solar cell module in which a plurality of solar cell elements are connected by a wiring member.

REFERENCE SIGNS LIST 1 solar cell element
1a light receiving surface (first surface)

1b back surface (second surface)
2a, 2c thin wire electrode
2b back surface collecting electrode
3 solder
3a solder bonding portion
3b side surface of solder bonding portion
4 thermosetting resin
4a thermosetting epoxy resin composition before being cured
4b thermosetting epoxy resin composition before being cured whose width is reduced
4c height of thermosetting resin
5 wiring member
5a protrusion-shaped portion
10 solar cell string
11 light-receiving-surface protective member
12 back-surface protective member
13 sealing member
100 solar cell module

The invention claimed is:

1. A solar cell module that includes a configuration in which a plurality of thin linear thin wire electrodes is formed over a first surface that is a light receiving surface of a solar cell element, a back surface collecting electrode is formed on a second surface that is a back surface of the solar cell element, and a wiring member which draws power is connected to each of the thin wire electrodes and the back surface collecting electrode, wherein
a solder bonding portion, in which the wiring member and the thin wire electrode are bonded with melted solder, is formed for each of the thin wire electrodes, and a bonding region, in which the wiring member and the first surface are bonded with a thermosetting resin, is formed between the solder bonding portions in an extending direction of the wiring member,
a width of the thin wire electrode in the solder bonding portion is increased in the extending direction of the wiring member,
the solder is in direct contact with lateral sides of the thin wire electrode,
a width of the solder is gradually reduced in the extending direction of the wiring member toward a surface of the solar cell element from a lower surface of the wiring member, and
side surfaces of the solder bonding portion in the extending direction of the wiring member are coated with the thermosetting resin.

2. The solar cell module according to claim 1, wherein
the wiring member includes a protrusion-shaped portion on a surface that faces the first surface, and
the protrusion-shaped portion and the first surface are bonded with the thermosetting resin in a region excluding the thin wire electrodes.

3. The solar cell module according to claim 1, wherein a height of a thermosetting resin that coats side surfaces of the solder bonding portion from a thin wire electrode surface is equal to or smaller than ½ of a thickness of the wiring member.

4. The solar cell module according to claim 1, wherein the thermosetting resin contains an epoxy resin, and further contains an organic acid or uses an organic acid as a curing agent.

5. A manufacturing method of a solar cell module according to claim 1, comprising:
a first step of arranging a thermosetting epoxy resin composition at a predetermined position of the first surface;
a second step of bringing the thin wire electrode and the wiring member into contact with each other, moving the thermosetting epoxy resin composition to a side of the wiring member on the thin wire electrode, and holding the thermosetting epoxy resin composition between the wiring member and the first surface, between the thin wire electrodes, by pressing the wiring member coated with solder against the thermosetting epoxy resin composition arranged in the first step while heating at a softening temperature of the thermosetting epoxy resin composition; and
a third step of, while heating the wiring member and the thermosetting epoxy resin composition held on a lower surface of the wiring member to a temperature that is equal to or higher than a curing start temperature of the thermosetting epoxy resin composition and is equal to or higher than a melting point of the solder, forming a solder bonding portion by bonding the thin wire electrode and the wiring member with melted solder and causing a thermosetting epoxy resin composition exuded to sides of the solder bonding portion to be cured, and bonding the wiring member between the thin wire electrodes to the first surface with a thermosetting epoxy resin composition by causing the thermosetting epoxy resin composition on the lower surface of the wiring member between the thin wire electrodes to be cured,
the method comprising coating side surfaces of the solder bonding portion in an extending direction of the wiring member, with the thermosetting epoxy resin.

6. The manufacturing method of a solar cell module according to claim 5, wherein a width of the thermosetting epoxy resin composition arranged on the first surface of the solar cell element is set narrower than a width of the wiring member.

7. The solar cell module according to claim 1, wherein the thermosetting resin is an adhesive resin, and the thermosetting resin coats the side surfaces of the solder bonding portion in the extending direction of the wiring member from outside of the side surfaces, but is confined within a widthwise extent of the wiring member in the bonding region, to reinforce the solder bonding portion.

8. The solar cell module according to claim 1, wherein the thermosetting resin is an adhesive resin, and the thermosetting resin coats the side surfaces of the solder bonding portion in the extending direction of the wiring member from outside of the side surfaces, but is confined within a widthwise extent of the wiring member in the bonding region, to reinforce the solder bonding portion, and
in the bonding region the wiring member and the first surface are bonded with the thermosetting resin.

9. The solar cell module according to claim 4, wherein a surface of the solder or of the wiring member that faces toward the thin wire electrode in the solder bonding portion does not include an oxide film.

* * * * *